United States Patent
Mosley et al.

(10) Patent No.: US 8,372,485 B2
(45) Date of Patent: *Feb. 12, 2013

(54) GALLIUM INK AND METHODS OF MAKING AND USING SAME

(75) Inventors: David Mosley, Lafayette Hill, PA (US); David Thorsen, Pitman, NJ (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/030,171

(22) Filed: Feb. 18, 2011

(65) Prior Publication Data

US 2012/0214292 A1 Aug. 23, 2012

(51) Int. Cl.
*B05D 3/02* (2006.01)
*C09D 11/00* (2006.01)

(52) U.S. Cl. .............. 427/380; 106/1.05; 106/31.13; 106/31.92; 252/500; 252/512; 257/42; 257/E21.09; 257/E21.114; 257/E21.411; 257/E29.296; 427/76; 427/256; 427/384; 438/95; 438/102; 438/197; 438/285; 438/478; 438/483; 438/502; 438/590; 438/603

(58) Field of Classification Search ............ 106/1.05, 106/31.13, 31.92; 136/262; 427/76, 380, 427/384, 256; 438/95, 102, 104, 197, 285, 438/478, 483, 502, 590, 603; 252/500, 512; 257/42, E21.09, E21.068, E21.633, E21.114, 257/E21.411, E29.296

See application file for complete search history.

(56) References Cited

U.S. PATENT DOCUMENTS

| | | |
|---|---|---|
| 5,863,836 A | 1/1999 | Jones |
| 6,126,740 A | 10/2000 | Schulz et al. |
| 6,379,585 B1 | 4/2002 | Vecht et al. |
| 7,094,651 B2 | 8/2006 | Mitzi et al. |
| 7,494,841 B2 | 2/2009 | Mitzi et al. |
| 7,524,528 B2 | 4/2009 | Kodas et al. |
| 2008/0135812 A1 | 6/2008 | Yu et al. |
| 2008/0280030 A1 | 11/2008 | van Duren et al. |
| 2010/0029036 A1 | 2/2010 | Robinson et al. |
| 2012/0082794 A1* | 4/2012 | Calzia et al. ........... 427/380 |

FOREIGN PATENT DOCUMENTS

| | | |
|---|---|---|
| WO | 9304212 | 3/1993 |
| WO | 2008057119 | 5/2008 |
| WO | 2008063190 | 5/2008 |

OTHER PUBLICATIONS

Mitzi, et al., A high-efficiency solution-deposited thin-film photovoltaic device, Advanced Materials, vol. 20, pp. 3657-3662 (2008)Mitzi, et al., A high-efficiency solution-deposited thin-film photovoltaic device, Advanced Materials, vol. 20, pp. 3657-3662 (2008).
Mitzi, et al., Low-voltage transistor employing a high-mobility spin-coated chalcogenide semiconductor, Advanced Materials, vol. 17, pp. 1285-1289 (2005).
Lu, et al., Study of the dissolution behavior of selenium and tellurium in different solvents—A novel route to Se, Te tubular bulk single crystals, Journal of Materials Chemistry, vol. 12, (2002).
Chichibu, et al. Use of diethylselenide as a less-hazardous source for preparation of CuInSe2 photo-absorbers by selenization of metal precursors, Journal of Crystal Growth, vol. 243, (2002).
Kemell, et al., Thin film deposition methods for CuInSe2 solar cells, Critical Reviews in Solid State and Materials Sciences, vol. 30, pp. 1-31 (2005).
Weil, et al., CuInS2 Solar Cells by Air Stable Ink Rolling, Journal of American Chemical Society, vol. 132, No. 19, pp. 6642-6643 (2010).
Ryan, et al. Preparation of Dithioselenides via a Selenium Transfer Reagent, Tetrahedron Letters, vol. 38, No. 51, pp. 8829-8832 (1997).
Pitts, et al, Indium metal as reducing agent in organic synthesis, J. Chem. Soc., Perkin Trans. 1, 955-977 (2001).
Copending U.S. Appl. No. 13/030,175, filed Feb. 28, 2011.

* cited by examiner

*Primary Examiner* — Bijan Ahvazi
(74) *Attorney, Agent, or Firm* — Thomas S. Deibert

(57) ABSTRACT

A gallium ink is provided, comprising, as initial components: a gallium component comprising gallium; a stabilizing component; an additive; and, a liquid carrier; wherein the gallium ink is a stable dispersion. Also provided are methods of preparing the gallium ink and for using the gallium ink in the preparation of semiconductor films (e.g., in the deposition of a CIGS layer for use in photovoltaic devices).

7 Claims, No Drawings

GALLIUM INK AND METHODS OF MAKING AND USING SAME

The present invention relates to a gallium ink comprising, as initial components: a gallium component comprising gallium; a stabilizing component, wherein the stabilizing component is selected from 1,3-propanedithiol, beta-mercaptoethanol, analogs thereof and mixtures thereof; an additive, wherein the additive is selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group; tetrazole; tetrazole substituted with a $C_{1-5}$ alkyl group; 1,5-diazabicyclo[4.3.0]non-5-ene; and 1,8-diazabicyclo[5.4.0]undec-7-ene; and, a liquid carrier; wherein the gallium ink is a stable dispersion. The present invention further relates to a method of preparing the gallium ink and for using the gallium ink to deposit gallium on a substrate.

One very promising application for gallium is in the manufacture of photovoltaic cells for the conversion of sunlight into electricity. In particular, the manufacture of photovoltaic cells based on Group 1b-3a-6a mixed-metal chalcogenide materials, including for example, copper-gallium-diselenide ($CuGaSe_2$) and copper-indium-gallium-diselenide ($CuIn_{1-x}Ga_xSe_2$), are of considerable interest because of their high solar energy to electrical energy conversion efficiencies. The Group 1b-3a-6a mixed metal chalcogenide semiconductors are sometimes referred to generically as CIGS materials. Conventional CIGS solar cells include a back electrode such as a layer of molybdenum, a CIGS absorber layer, a CdS junction partner layer, an optional transparent buffer layer such as a zinc oxide, and a transparent conductive oxide layer electrode (e.g., aluminum doped $ZnO_x$, indium tin oxide, $SnO_2$); wherein the molybdenum layer is deposited over a substrate, the CIGS absorber layer is interposed between the molybdenum layer and the CdS junction partner and the CdS junction partner is interposed between the CIGS absorber layer and the transparent conductive oxide layer electrode.

One challenge for the promising use of deposited films of CIGS absorber layer materials is the development of cost-effective manufacturing techniques. Conventional methods for depositing CIGS materials typically involve the use of vacuum based processes, including, for example, vacuum evaporation, sputtering and chemical vapor deposition (e.g., metal-organic chemical vapor deposition). Such deposition techniques tend to exhibit low throughput capabilities and high cost. To facilitate the large scale, high throughput, low cost, manufacture of systems incorporating the use of deposited CIGS materials, it would be desirable to provide liquid based deposition techniques.

A method for depositing thin films containing gallium is disclosed in U.S. Patent Application Publication No. 2010/029036 to Robinson et al. Robinson et al. disclose methods and devices for forming thin-films from solid group 3a particles. Specifically, a method is described comprising: providing a first material comprising an alloy of a) a group 3a based material and b) at least one other material. The other material may be included in an amount sufficient so that no liquid phase of the alloy is present within the first material in a temperature range between room temperature and a deposition or predeposition temperature higher than room temperature, wherein the group 3a based material is otherwise liquid in that temperature range. The other material may be a group 1a material. A precursor material may be formulated comprising particles of the first material and particles containing at least one element from the group consisting of group 1b, group 3a, group 6a, alloys containing any of the foregoing elements, or combinations thereof. The temperature range described above may be between 20 and 200° C.

Accordingly, there remains a need for a liquid deposition method for use in the manufacture of semiconductor systems incorporating gallium (e.g., CIGS based photovoltaic devices). In particular, there remains a need for a gallium ink comprising a stable dispersion of gallium in a liquid carrier.

The present invention provides a gallium ink, comprising, as initial components: a gallium component comprising gallium; a stabilizing component is selected from 1,3-propanedithiol, beta-mercaptoethanol, analogs thereof and mixtures thereof; an additive, wherein the additive is selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group; tetrazole; tetrazole substituted with a $C_{1-5}$ alkyl group; 1,5-diazabicyclo[4.3.0]non-5-ene; and 1,8-diazabicyclo[5.4.0]undec-7-ene; and, a liquid carrier; wherein the gallium ink is a stable dispersion.

The present invention provides a gallium ink, comprising, as initial components: a gallium component comprising gallium; a stabilizing component is selected from 1,3-propanedithiol, beta-mercaptoethanol, analogs thereof and mixtures thereof; an additive, wherein the additive is selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group; tetrazole; tetrazole substituted with a $C_{1-5}$ alkyl group; 1,5-diazabicyclo[4.3.0]non-5-ene; and 1,8-diazabicyclo[5.4.0]undec-7-ene; and, a liquid carrier, wherein the liquid carrier is selected from ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine; 2-methylpyrazine and mixtures thereof; wherein the gallium ink is a stable dispersion.

The present invention provides a method of preparing a gallium ink of the present invention, comprising: providing a gallium component comprising gallium; providing a stabilizing component, wherein the stabilizing component is selected from 1,3-propanedithiol, beta-mercaptoethanol, analogs thereof and mixtures thereof; providing an additive, wherein the additive is selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group; tetrazole; tetrazole substituted with a $C_{1-5}$ alkyl group; 1,5-diazabicyclo[4.3.0]non-5-ene; and 1,8-diazabicyclo[5.4.0]undec-7-ene; providing a liquid carrier; combining the gallium component, the stabilizing component, the additive and the liquid carrier; and, heating the combination with agitation in an inert atmosphere to produce a gallium ink.

The present invention provides a method for depositing gallium on a substrate, comprising: providing a substrate; providing a gallium ink of the present invention; applying the gallium ink on the substrate; heating the applied gallium ink to eliminate the additive and the liquid carrier, depositing gallium on the substrate; and, optionally, annealing the deposited gallium.

DETAILED DESCRIPTION

The term "stable" as used herein and in the appended claims in reference to the gallium ink means that the gallium ink does not form a precipitate during storage of the gallium ink at 22° C. under nitrogen for a period of 30 minutes.

The term "storage stable" as used herein and in the appended claims in reference to the gallium ink means that the gallium ink does not form a precipitate during storage of the gallium ink at 22° C. under nitrogen for a period of twenty four (24) hours.

The term "extended stability" as used herein and in the appended claims in reference to the gallium ink means that the gallium ink does not form a precipitate during storage of the gallium ink at 22° C. under nitrogen for a period of seven (7) days.

The present invention relates to a gallium ink, the preparation of the gallium ink and the use of the gallium ink in the manufacture of gallium containing devices such as thin film photovoltaic cells.

Preferably, the gallium material used, as an initial component, in the present invention is gallium shot or gallium ingot.

Preferably, the stabilizing component used, as an initial component, in the present invention is selected from the group consisting of 1,3-propanedithiol, beta-mercaptoethanol, analogs thereof and mixtures thereof. More preferably, the stabilizing component is selected from the group consisting of 1,3-propanedithiol, beta-mercaptoethanol and mixtures thereof. Still more preferably, the stabilizing component is selected from the group consisting of 1,3-propanedithiol and beta-mercaptoethanol. Most preferably, the stabilizing component is 1,3-propanedithiol.

Additive used in the gallium ink of the present invention is selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group (e.g., 1-methylimidazole); tetrazole; tetrazole substituted with a $C_{1-5}$ alkyl group; 1,5-diazabicyclo[4.3.0]non-5-ene; and 1,8-diazabicyclo[5.4.0]undec-7-ene. Preferably, the additive is selected from the group consisting of 1,5-diazabicyclo[4.3.0]non-5-ene; 1,8-diazabicyclo[5.4.0]udec-7-ene; pyrrolidino-1-cyclohexene; 1-methylimidazole; pyrazine and 2-methylpyrazine. One of ordinary skill in the art will recognize that Stork enamines are formed from a secondary amine (like pyrrolidine) and a ketone. Commercially available Stork enamines include pyrrolidino-1-cyclohexene and pyrrolidino-1-cyclopentene. Note that Stork enamines can be made in situ by the reaction of a secondary amine and a ketone under dehydrating conditions.

Liquid carrier used in the gallium ink of the present invention can be any solvent or miscible mixtures of solvents in which gallium is stably dispersible in the presence of the additive. Preferably, the liquid carrier used is selected from amines, ethers, polyethers, amide solvents (e.g., dimethylformamide, dimethylacetamide), N-methylpyrrolidone, keto-solvents (e.g., methylisobutylketone), aryl solvents (e.g., toluene), cresols, xylene and miscible mixtures thereof. Optionally, the liquid carrier used is selected from ethers, polyethers, amide solvents (e.g., dimethylformamide, dimethylacetamide), N-methylpyrrolidone, keto-solvents (e.g., methylisobutylketone), aryl solvents (e.g., toluene), cresols, xylene and miscible mixtures thereof. Optionally, the liquid carrier is selected from a nitrogen containing solvent and a miscible mixture of nitrogen containing solvents. More preferably, the liquid carrier used comprises a liquid amine having a formula $NR_3$, wherein each R is independently selected from a H, a $C_{1-10}$ alkyl group, a $C_{6-10}$ aryl group, a $C_{3-10}$ aminocycloalkyl group (e.g., 1,2-diamino cyclohexyl) and a $C_{1-10}$ aminoalkyl group. Still more preferably, the liquid carrier used in the gallium ink of the present invention is selected ethylene diamine; diethylenetriamine; tris(2-aminoethyl) amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine; 2-methylpyrazine and mixtures thereof. Most preferably, the liquid carrier is selected from the group consisting of 1,3-diaminopropane; 1,2-diaminopropane; 2-methylpyrazine and mixtures thereof.

The gallium ink of the present invention, optionally, further comprise a cosolvent. Cosolvents suitable for use with the present invention are miscible with the liquid carrier. Preferred cosolvents exhibit a boiling point within 30° C. of the boiling point of the liquid carrier.

The gallium ink of the present invention, optionally, further comprise at least one optional modifier selected from a dispersant, a wetting agent, a polymer, a binder, an anti-foaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant (e.g., sodium to improve electrical performance of CIGS materials). Optional modifiers can be incorporated into the gallium ink of the present invention to, for example, facilitate increased shelf life, to improve flow characteristics to facilitate the method of application to a substrate (e.g., printing, spraying), to modify the wetting/spreading characteristics of the ink onto the substrate, to enhance the compatibility of the gallium ink with other inks used to deposit other components on the substrate (e.g., other constituents of a CIGS material, such as Cu, In, Se and S), and to modify the decomposition temperature of the gallium ink. Some optional flow control and viscosity modifiers include polyethyleneimines, polyvinylpyrrolidones and Jeffamines.

The method of preparing a gallium ink of the present invention, comprises: providing the gallium component comprising gallium; providing a stabilizing component, wherein the stabilizing component is selected from 1,3-propanedithiol, beta-mercaptoethanol, analogs thereof and mixtures thereof; providing an additive, wherein the additive is selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group; tetrazole; tetrazole substituted with a $C_{1-5}$ alkyl group; 1,5-diazabicyclo[4.3.0]non-5-ene; and 1,8-diazabicyclo[5.4.0]undec-7-ene; providing a liquid carrier; combining the gallium component, the stabilizing component, the additive and the liquid carrier; and, heating the combination with agitation in an inert atmosphere to produce the gallium ink. Preferably, in the method of making the gallium ink of the present invention, the gallium provided is gallium shot or ingot. Preferably, providing the liquid carrier component for use in the preparation of the gallium ink of the present invention, comprises: providing a liquid carrier (as described hereinabove) in which the product formed by the combination of the gallium component, the additive and the liquid carrier is stable. More preferably, in the method of making the gallium ink of the present invention, the liquid carrier provided is selected from 1,3-diaminopropane; 1,2-diaminopropane; pyrazine; 2-methylpyrazine and mixtures thereof. Most preferably, in the method of making the gallium ink of the present invention, the gallium provided is gallium shot or ingot and the liquid carrier provided is selected from 1,3-diaminopropane; 1,2-diaminopropane; pyrazine; 2-methylpyrazine and mixtures thereof.

Optionally, the method of preparing the gallium ink of the present invention, further comprises: providing a cosolvent; and, combining the cosolvent with the gallium component, the stabilizing component, the additive and the liquid carrier. Suitable cosolvents are miscible with the liquid carrier component contained in the gallium ink and do not have the effect of destabilizing the gallium ink. Preferred cosolvents further exhibit a boiling point within 30° C. of the boiling point of the liquid carrier component contained in the gallium ink.

Optionally, the method of preparing the gallium ink of the present invention, further comprises: providing an optional modifier; and, combining the optional modifier with the liquid carrier component; wherein the optional modifier is selected from a dispersant, a wetting agent, a polymer, a binder, an anti-foaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant.

The gallium ink of the present invention can be used in the preparation of a variety of semiconductor materials comprising gallium (e.g., thin layer solar cells).

Preferably, the method for applying a gallium ink on a substrate, comprises: providing a substrate; providing a gallium ink of the present invention; applying the gallium ink to the substrate; heating the applied gallium ink to eliminate the additive and the liquid carrier, depositing gallium on the substrate; and, optionally, annealing the deposited gallium.

The gallium ink of the present invention can be applied onto a substrate using conventional processing techniques such as wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray pyrolysis and spray deposition. Preferably, the gallium ink of the present invention is applied onto a substrate using conventional spray deposition techniques. Preferably, the gallium ink of the present invention is applied onto a substrate under an inert atmosphere (e.g., under nitrogen).

Preferably, when treating the applied gallium ink to remove the stabilizing component, the additive and the liquid carrier, the applied gallium ink is heated to a temperature above the boiling point temperature of the additive and the liquid carrier. Optionally, the applied gallium ink is heated to a temperature of 5 to 600° C. Optionally, the applied gallium ink is heated to a temperature of 5 to 600° C. under vacuum.

Preferably, the deposited gallium material can be treated to facilitate removal of carbon. Optionally, the deposited gallium is heated to a temperature of 80 to 600° C. for a period of 30 seconds to one hour in an inert atmosphere.

The substrate used can be selected from conventional materials used in conjunction with the preparation of a semiconductor comprising selenium or in conjunction with chalcogenide containing phase change memory devices. For use in some applications, the substrate preferably comprises a layer of material selected from molybdenum, aluminum and copper. For use in the preparation of CIGS materials for use in photovoltaic devices, the substrate preferably comprises a layer of molybdenum. In some applications, the molybdenum, aluminum or copper substrate layer can be a coating on a carrier substance, such as, glass, foil, and plastic (e.g., polyethylene terephthalate and polyimides). Optionally, the substrate is sufficiently flexible to facilitate roll-to-roll production of CIGS materials for use in photovoltaic devices.

Optionally, the method for depositing gallium on a substrate further comprises annealing the deposited gallium Annealing temperatures for the deposited gallium can range from 200 to 650° C. with annealing times of 30 seconds to 5 hours. Optionally, the annealing process is a two stage anneal. In the first annealing stage the deposited gallium is heated to a temperature of 200 to 600° C. with a first stage annealing time of 30 seconds to 1 hour. In the second annealing stage the deposited gallium is heated to a temperature of 200 to 650° C. with a second stage annealing time of 30 seconds to 1 hour.

Using the method of depositing gallium of the present invention, it is possible to provide uniform or graded semiconductor films. For example, a graded CIGS material can be prepared. In the preparation of CIGS materials it is sometimes desirable to provide graded films (e.g., with respect to Ga concentration). It is conventional to provide a graded Ga/(Ga+In) ratio as a function of depth in a CIGS material for use in photovoltaic devices to facilitate improved separation of the photogenerated charge carriers and to facilitate reduced recombination at the back contact. Accordingly, it is believed to be desirable to tailor the CIGS material composition to achieve the desired grain structure and the highest efficiency photovoltaic device characteristics.

Some embodiments of the present invention will now be described in detail in the following Examples.

EXAMPLES 1-21

Preparation of Gallium Ink

Gallium inks were prepared using the materials and amounts thereof indicated in TABLE 1. Specifically, for each example noted in TABLE 1 gallium metal was weighed out into a reactor, outfitted with a stir bar. The liquid carrier was then added to the reactor followed by any additional solid materials listed in TABLE 1 (i.e., pyrazine). The reactor was then assembled in the glove box sealing the reactor under nitrogen. The reactor was then transferred to a fume hood where the reactor was maintained under positive nitrogen pressure with a nitrogen manifold. The remaining liquid materials were then added via septa on the reactor using an inert syringe. The contents of the reactor were then treated under the reaction conditions noted in Table 1. Upon cooling, the reactor was transferred into the glove box for unloading. The product inks were then decanted from the reactor to remove any residual solids. The decanted product inks were observed to remain clear and stable following storage for one week at room temperature under nitrogen (i.e., no suspended solids were evident).

EXAMPLE 22-25

Gallium Ink Analysis

Decanted product Gallium inks from Examples 10, 12 and 14-15 were placed into a separate round bottom flask under nitrogen. Volatiles were then removed from the product samples under reduced pressure. For Example 22, the volatiles were removed by initially rotovaping at 2.67 kPa and 80-85° C. For Examples 23-25, the volatiles were removed by initially performing short-path distillation at 0.13 kPa and 80-85° C. All samples were then left under house vacuum at 2.67 kPa for two days to remove any residual volatiles. The sample material left in the round bottom flasks was then analyzed by inductively coupled plasma optical emission spectrometry (ICP-OES). The results of those analyzes are provided in TABLE 2.

TABLE 2

| | Example # | | | |
|---|---|---|---|---|
| | 22 | 23 | 24 | 25 |
| Gallium Ink From Example # | 10 | 12 | 14 | 15 |
| Initial Ink Mass (in g) | 3 | 4 | 3 | 3 |
| Theoretical Ga Concentration in Initial Ink (wt %) | 3 | 2 | 2 | 2 |
| Theoretical Mass Ga in Ink (in g) | 0.09 | 0.08 | 0.06 | 0.06 |
| Ink Mass After Stripping (in g) | 0.456 | 0.392 | 0.396 | 0.506 |
| Measured Mass Ga in Ink (in g) | 0.053 | 0.020 | 0.050 | 0.042 |
| Measured Mass S in Ink (in g) | 0.097 | 0.077 | 0.098 | 0.086 |
| Measured Mass C in Ink (in g) | 0.19 | 0.18 | 0.16 | 0.20 |
| Measured Mass H in Ink (in g) | 0.031 | 0.031 | 0.030 | 0.039 |
| Measured Mass N in ink (in g) | 0.052 | 0.049 | 0.053 | 0.070 |

TABLE 1

| Ex. | Ga (in g) | Stabilizing Component (SC) | SC (in g) | Additive (A) | A (in g) | Liquid Carrier (LC) | LC (in g) | Cond |
|---|---|---|---|---|---|---|---|---|
| 1 | 0.066 | 1,3-propane dithiol | 0.204 | 1,5-diazobicyclo[4.3.0]non-5-ene | 0.234 | 2-methyl pyrazine | 2.8 | A |
| 2 | 0.066 | beta-mercaptoethanol | 0.258 | 1,5-diazobicyclo[4.3.0]non-5-ene | 0.234 | 2-methyl pyrazine | 2.74 | A |
| 3 | 0.066 | 1,3-propane dithiol | 0.204 | 1,5-diazobicyclo[4.3.0]non-5-ene | 0.234 | 1,3-diamino propane | 2.8 | A |
| 4 | 0.149 | 1,3-propane dithiol | 0.463 | 1,5-diazobicyclo[4.3.0]non-5-ene | 0.798 | 1,3-diamino propane | 6.09 | B |
| 5 | 0.146 | 1,3-propane dithiol | 0.455 | 1,5-diazobicyclo[4.3.0]non-5-ene | 1.04 | 1,3-diamino propane | 5.7 | B |
| 6 | 0.192 | 1,3-propane dithiol | 0.597 | 1,5-diazobicyclo[4.3.0]non-5-ene | 1.03 | 1,3-diamino propane | 2.99 | B |
| 7 | 0.272 | 1,3-propane dithiol | 0.846 | 1,5-diazobicyclo[4.3.0]non-5-ene | 1.94 | 1,3-diamino propane | 3.74 | B |
| 8 | 0.212 | beta-mercaptoethanol | 0.832 | 1,5-diazobicyclo[4.3.0]non-5-ene | 1.13 | 1,3-diamino propane | 3.13 | B |
| 9 | 0.361 | beta-mercaptoethanol | 1.41 | 1,5-diazobicyclo[4.3.0]non-5-ene | 2.57 | 1,3-diamino propane | 4.67 | B |
| 10 | 0.358 | 1,3-propane dithiol | 1.11 | 1,5-diazobicyclo[4.3.0]non-5-ene | 1.91 | 1,3-diamino propane | 8.52 | C |
| 11 | 0.435 | 1,3-propane dithiol | 1.352 | 1,5-diazobicyclo[4.3.0]non-5-ene | 3.11 | 1,3-diamino propane | 9.66 | C |
| 12 | 0.266 | beta-mercaptoethanol | 1.043 | 1,5-diazobicyclo[4.3.0]non-5-ene | 1.42 | 1,3-diamino propane | 10.52 | C |
| 13 | 0.23 | beta-mercaptoethanol | 0.903 | 1,5-diazobicyclo[4.3.0]non-5-ene | 1.64 | 1,3-diamino propane | 8.78 | C |
| 14 | 0.2 | 1,3-propane dithiol | 0.619 | 2-methyl pyrazine | 0.862 | 1,3-diamino propane | 8.32 | D |
| 15 | 0.2 | beta-mercaptoethanol | 0.674 | 2-methyl pyrazine | 0.862 | 1,3-diamino propane | 8.26 | D |
| 16 | 0.194 | 1,3-propane dithiol | 0.601 | 2-methyl pyrazine | 0.914 | 1,3-diamino propane | 8 | E |
| 17 | 0.21 | beta-mercaptoethanol | 0.706 | 2-methyl pyrazine | 0.992 | 1,3-diamino propane | 8.57 | E |
| 18 | 0.115 | 1,3-propane dithiol | 0.357 | 1,8-diazabicyclo[5.4.0]udec-7-ene | 0.803 | 1,3-diamino propane | 10.32 | F |
| 19 | 0.106 | 1,3-propane dithiol | 0.330 | pyrrolidino-1-cyclohexene | 0.738 | 1,3-diamino propane | 9.51 | F |
| 20 | 0.110 | 1,3-propane dithiol | 0.342 | 1-methyl imidazole | 0.415 | 1,3-diamino propane | 10.25 | F |
| 21 | 0.127 | 1,3-propane dithiol | 0.396 | pyrazine | 0.468 | 1,3-diamino propane | 11.72 | F |

A reactor was placed on an aluminum heating block, the heating block temperature was then set and maintained at 60° C. for 1 hr; the heating block temperature was then set and maintained at 100° C. for 1 hr; the heating block temperature was then set and maintained at 140° C. overnight; the reactor was then removed from the heating source and allowed to cool.
B reactor was placed on an aluminum heating block, the heating block temperature was then set and maintained at 120° C. for 24 hrs; the heating block temperature was then set and maintained at 140° C. for 4 hrs; the reactor was then removed from the heating source and allowed to cool.
C reactor was placed on an aluminum heating block, the heating block temperature was then set and maintained at 140° C. for 24 hrs; the heating block temperature was then set and maintained at 150° C. for 4 hrs; the heating block temperature was then set and maintained at 160° C. for 2 hrs; the reactor was then removed from the heating source and allowed to cool.
D reactor was placed on an aluminum heating block, the heating block temperature was then set and maintained at 160° C. for 7 hrs; the reactor was then removed from the heating source and allowed to cool.
E reactor was placed on an aluminum heating block, the heating block temperature was then set and maintained at 140° C. for 6 hrs; the reactor was then removed from the heating source and allowed to cool.
F reactor was placed on an aluminum heating block, the heating block temperature was then set and maintained at 140° C. for 30 hrs; the reactor was then removed from the heating source and allowed to cool.

We claim:

1. A gallium ink, comprising, as initial components:
    a gallium component comprising gallium;
    a stabilizing component, wherein the stabilizing component is selected from the group consisting of 1,3-propanedithiol, beta-mercaptoethanol, analogs thereof and mixtures thereof;
    an additive, wherein the additive is selected from the group consisting of pyrazine; 2-methylpyrazine; 3-methylpyrazole, methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group; tetrazole; tetrazole substituted with a $C_{1-5}$ alkyl group; 1,5-diazabicyclo[4.3.0]non-5-ene; and 1,8-diazabicyclo[5,4.0]undec-7-ene; and,
    a liquid carrier;
    wherein the gallium ink is stable.

2. The gallium ink of claim 1, wherein the liquid carrier is selected from the group consisting of a nitrogen containing solvent and miscible mixtures of nitrogen containing solvents.

3. The gallium ink of claim 1, wherein the liquid carrier is a liquid amine having a formula $NR_3$, wherein each R is independently selected from the group consisting of a to H, a $C_{1-10}$ alkyl group, a $C_{6-10}$ aryl group and a $C_{1-10}$ aminoalkyl group.

4. The gallium ink of claim 1, wherein the liquid carrier is selected from the group consisting of ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine; 2-methyl pyrazine and mixtures thereof.

5. The gallium ink of claim 1, wherein the liquid carrier is selected from the group consisting of 1,3-diaminopropane; 1,2-diaminopropane; 2-methyl pyrazine and mixtures thereof.

6. A method of preparing a gallium ink according to claim 1, comprising:
    providing a gallium component comprising gallium;
    providing a stabilizing component, wherein the stabilizing component is selected from the group consisting of 1,3-propanedithiol, beta-mercaptoethanol, analogs thereof and mixtures thereof;
    providing an additive, wherein the additive is selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aiminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedcarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group; tetrazole; tetrazole substituted with a $C_{1-5}$ alkyl group; 1,5-diazabicyclo[4.3.0]non-5-ene; and 1,8-diazabicyclo[5.4.0]undec-7-ene;
    providing a liquid carrier;
    combining the gallium component, the stabilizing component, the additive and the liquid carrier; and
    heating the combination with agitation in an inert atmosphere to produce a gallium ink.

7. The method of claim 6, wherein the liquid carrier provided is selected from the group consisting of 1,3-diaminopropane; 1,2-diaminopropane; pyrazine; 2-methyl pyrazine and mixtures thereof.

* * * * *